US006194669B1

(12) United States Patent
Bjorndahl et al.

(10) Patent No.: US 6,194,669 B1
(45) Date of Patent: Feb. 27, 2001

(54) SOLDER BALL GRID ARRAY FOR CONNECTING MULTIPLE MILLIMETER WAVE ASSEMBLIES

(75) Inventors: William D. Bjorndahl; D. Ian Stones, both of Torrance; Kenneth C. Selk, Hermosa Beach; Roger A. Davidheiser, Manhattan Beach; Alfred E. Lee, Torrance, all of CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/245,317

(22) Filed: Feb. 5, 1999

(51) Int. Cl.[7] .............................. H01R 12/04; H05K 1/11
(52) U.S. Cl. .............................................. 174/261; 439/63
(58) Field of Search .................................... 174/260, 261, 174/262, 263, 264, 265; 361/772, 773, 774, 776; 439/65, 66, 67, 68, 69, 70, 71, 72, 73, 74, 75, 63

(56) References Cited

U.S. PATENT DOCUMENTS 3,634,807 * 1/1972 Grobe et al. ........................... 439/50
4,295,183 10/1981 Miersch et al. .
5,376,584 12/1994 Agarwala .
5,456,004 10/1995 Swamy .
5,522,132 * 6/1996 Mattei .................................... 29/846
5,593,082 1/1997 Ivanov et al. .
5,828,555 * 10/1998 Itoh ..................................... 361/784
5,994,983 * 11/1999 Andersson ........................... 333/246

* cited by examiner

*Primary Examiner*—Jayprakash N. Gandhi
*Assistant Examiner*—Jeremy Norris
(74) *Attorney, Agent, or Firm*—Michael S. Yatsko

(57) ABSTRACT

A high frequency coaxial interconnection solder ball grid array produces a low loss, reproducible electrical interconnection at the circuit board level for mounting one or more high frequency components, such as high frequency IMA modules. Since the coaxial interconnection ball grid array can be and is generally implemented as part of a larger ball grid array, high frequency signal generation, signal reception and digital processing can be combined in a single electronic component, such as a circuit board. A coaxial-like interconnection is formed from a plurality of solder balls configured in a three-by-three square array. The coaxial interconnection solder ball grid array includes a single centrally disposed solder ball for interconnecting with a centrally disposed conductor of a coaxial line and a plurality of solder balls surrounding the single centrally disposed solder ball, some balls of which interconnect with a coaxial ground shield of the coaxial line. When soldered together, the centrally disposed solder ball and the central conductor of the coaxial line have the appearance of a rod with a diameter having a standard 50 ohm impedance. The outer conductive shield or ground signal path of the coaxial line is connected with multiple solder balls, to achieve a lower inductance ground-to-ground connection.

34 Claims, 2 Drawing Sheets

24
18
22
20
20
16
22
22
10
20
20
22
26

SOLDER BALL GRID ARRAY FOR CONNECTING MULTIPLE MILLIMETER WAVE ASSEMBLIES

BACKGROUND OF THE INVENTION

The present invention relates generally to interconnection devices and more particularly to interconnection devices for mounting high-frequency multiple millimeter wave assemblies to circuit boards.

Rapid advances in technology have accelerated the need for packaging devices which can accommodate, among other factors, connection requirements, higher operating frequencies and increases in the numbers of inputs and outputs on integrated circuits. Conventional packaging devices include ball grid arrays (BGA), wire bonding, tape automated bonding (TAB), quad flat packs (QFP) and controlled collapse chip connections (C4 or flip chip). BGA packages tend to be particularly popular because they are easier to surface is mount on a printed circuit board than fine pitch peripheral lead packages, such as QFPs. This is because the outer leads of BGA packages are distributed on the lower surface of the package, rather than being restricted to the package perimeter and thus being easier to damage. Moreover, since BGA packages do not include peripheral leads, BGA packages take up less room on a printed circuit board, and may be closely spaced. This close spacing also allows for shorter interconnect lengths between packages, which results in improved electrical performance.

Conventional packaging technologies, including BGA packages, however, fail to address the specific needs of high frequency integrated microwave assemblies (IMAs), particularly with respect to providing low loss, reproducible electrical interconnections at the circuit board level for mounting high frequency IMAs. Specifically, known packaging techniques fail to provide the interconnections which would allow high frequency signal generation, signal reception and digital processing to be combined in a compact space, such as a single circuit board. Rather, separate high frequency coaxial connectors are required to interface the high frequency IMAs with the circuit board.

In high frequency IMAs, arrays of coaxial lines extending from IMA modules must be interconnected to the circuit board. Coaxial transmission lines, commonly employed for the propagation of microwave power in IMAs, include a cylindrical center conductor disposed within a cylindrical tubular outer conductor. Although more costly than open-wire transmission lines, coaxial lines completely enclose the electromagnetic fields, preventing radiation losses and providing shielding from nearby circuits. With a coaxial connector, signal loss is minimized since almost all of the electric field emanating from the signal conductor remains confined in the dielectric. A coaxial conductor will thus electrically insulate the central signal path from any other signals in the vicinity.

Deficiencies can exist with respect to performance in IMAs, particularly at very high frequencies if such interconnections are not properly accommodated. This is because slight variations in signal path impedance may dramatically impact transmission performance. Furthermore, the high frequency interconnection needs to be inexpensive, allowing its use in the commercial market place.

What is needed therefore is a low loss, economical device for connecting millimeter wave assemblies to coaxial lines on substrate boards which would allow high frequency signal generation, signal reception and digital processing to be combined in a single circuit board.

SUMMARY OF THE INVENTION

The preceding and other shortcomings of the prior art are addressed and overcome by the present invention which provides an apparatus for interfacing with a coaxial device having a central and ground conductor, including a plurality of electrically conductive structures disposed in an array, including a centrally disposed structure for receiving the central conductor and a plurality of ground structures disposed about the centrally disposed structure for receiving the ground conductor.

In another aspect, the present invention provides a high frequency coaxial interconnection ball grid array for providing connection to a coaxial line having a first and second conductor, including a center disposed electrically conductive ball for interfacing with the first conductor and a plurality of outer electrically conductive balls disposed about the center disposed ball for interfacing with the second conductor.

In still another aspect, the present invention provides a packaging structure, including a circuit board, a circuit board chip package connected to the circuit board wherein the circuit board chip package includes at least one coaxial interface having a central and ground conductor and a plurality of electrically conductive structures disposed in an array, including a centrally disposed structure for receiving the central conductor and a plurality of ground structures disposed about the centrally disposed structure for receiving the ground conductor, wherein the array is disposed between the circuit board and the circuit board chip package.

In a further aspect, the present invention provides a high frequency interconnection ball grid array for coaxially interconnecting an integrated microwave assembly with a circuit board assembly, including a center disposed solder ball for mating with an inner conductor of a coaxial line and a plurality of outer disposed solder balls for mating with an outer conductor of the coaxial line.

The foregoing and additional features and advantages of this invention will become apparent from the detailed description and accompanying drawing figures below. In the figures and the written description, numerals indicate the various features of the invention, like numerals referring to like features throughout for both the drawing figures and the written description.

DETAILED DESCRIPTION OF THE PREFERRED EMBODIMENTS

Figure 1:
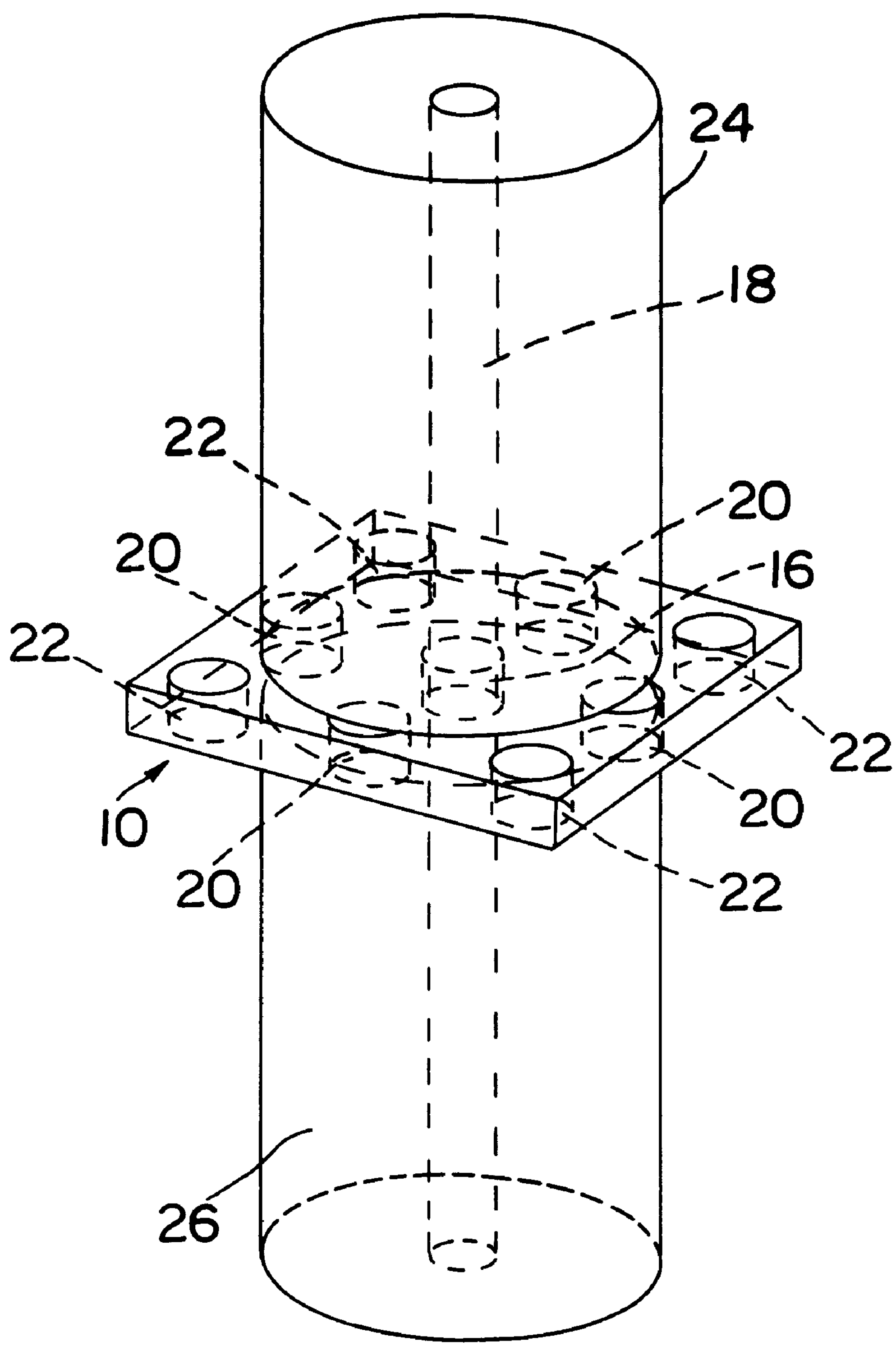
FIG. 1 is a perspective view of a high-frequency coaxial interconnection ball grid array for connecting coaxial ports of a millimeter wave module with coaxial lines on a circuit board in accordance with a preferred embodiment of the present invention.
Figure 2:
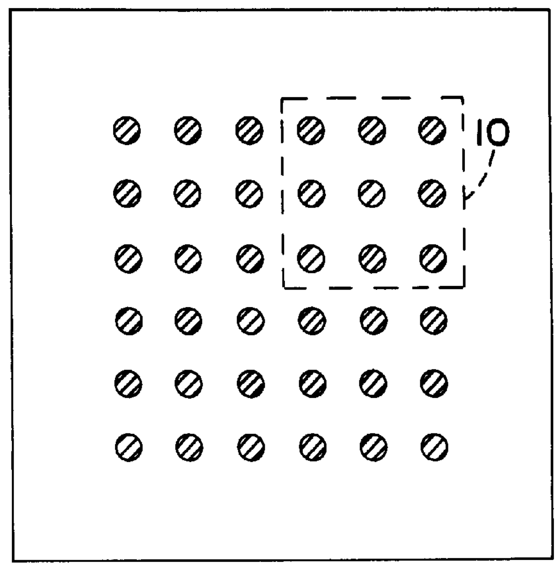
FIG. 2 is a top, cross-sectional view of a ball grid array including the coaxial interconnection ball grid array of the present invention.
Figure 3:
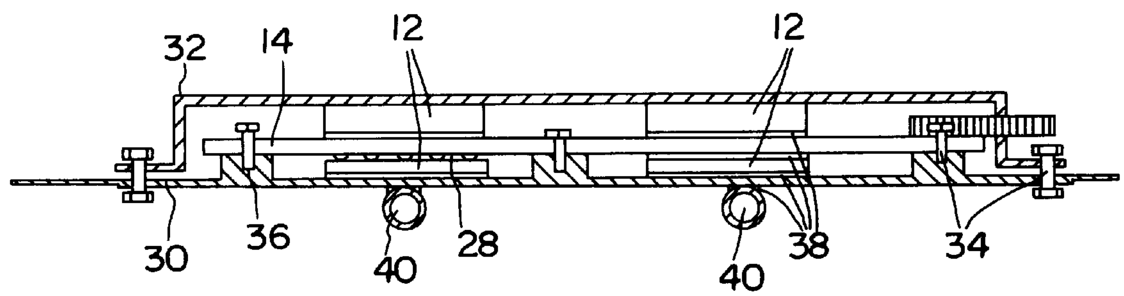
FIG. 3 is a cross-sectional view of an example implementation of a circuit board system including the coaxial interconnection ball grid array illustrated in FIG. 1.

Referring to FIGS. 1, 2 and 3, a high frequency coaxial interconnection ball grid array 10 for producing a low loss, reproducible electrical interconnection at the circuit board level for mounting one or more high frequency components 12, such as high frequency IMA modules, is illustrated. In particular, arrays of coaxial lines, extending from the high frequency component to be mounted, may be connected to a circuit board at millimeter wave frequencies (typically up to 60 Ghz). Since the coaxial interconnection bail grid array 10 can be and is generally implemented as part of a larger ball grid array, high frequency signal generation, signal reception and digital processing can be combined in a single electronic component, such as a circuit board 14. The coaxial interconnection ball grid array 10 is preferably implemented with solder connections, although other connections, including but not limited to, epoxy coiled wire (Fuzz butter) and gold connections may be used as well.

The high frequency coaxial interconnection ball grid array 10 of the present invention is not limited to the specific configurations shown and discussed herein. Any interconnect structure that uses a predetermined geometrical pattern of conductive balls, bumps, or other objects to provide a high-isolation-interconnect structure between a printed wiring board and an active microwave component may be utilized. Further, the present invention is not limited to providing interconnection for high frequency IMA modules, but rather may be utilized to interconnect integrated circuit (IC) assembly modules or circuit board chip package in general. Such integrated circuit assembly modules may include, but are not limited to, full- and semi-custom application specific integrated circuits (ASICs) and other high performance IC chips. Nor is the present invention limited to connecting IC assembly modules to printed circuit boards. Rather, the coaxial interconnection ball grid array 10 of the present invention may be utilized to connect the modules to any electronic component having a coaxial interface. It is thus understood that there are many other configurations which may utilize the coaxial-like high frequency interconnection of the present invention which are shown and discussed herein.

As is illustrated in FIGS. 1, 2 and 3, the coaxial interconnection ball grid array 10 interconnects the coaxial port of a millimeter wave module 12 with a coaxial port on an electronic component, such as a polymeric circuit board 14. The present invention connects high frequency signals up to 60 Ghz from a circuit board 14 to a millimeter wave module 12, thereby allowing highly integrated microwave networks to be built from a plurality of modules 12. The millimeter wave modules 12 which may be interconnected utilizing the present invention include, but are not limited to, high frequency transmitters, receivers or oscillators.

Referring to FIG. 1, a coaxial-like interconnection is formed from a plurality of solder balls configured preferably in a three-by-three square array 10. In particular, the coaxial interconnection ball grid array 10 includes a single centrally disposed solder ball 16 for interconnecting with a centrally disposed conductor 18 of a coaxial line 26. The coaxial interconnection ball grid array 10 also includes a plurality of solder balls 20 and 22 surrounding the single centrally disposed solder ball 16, some balls 20 of which interconnect with a coaxial ground shield 24 of the coaxial line 26. Each center conductor 18 of a connecting coaxial line 26 is thus interconnected utilizing a single solder ball 16. Referring to FIG. 1, when soldered together, the centrally disposed solder ball 16 and centrally disposed conductor 18 have the appearance of a rod with a diameter having a standard 50 ohm impedance. The outer conductive shield 24 or ground signal path of the coaxial line 26 is connected with multiple solder balls 20, to achieve a lower inductance ground-to-ground connection. In a typical configuration, the solder balls 20 are soldered to the shield 24 on the circuit board 14. Thus, the center conductor 18 of the coaxial line 26 is connected to the center solder ball 16 and the outer conductor 24 of the same coaxial line 26 is connected to the four solder balls 20 located closest to the center solder ball 16.

The diameter of each of the solder balls 16, 20 and 22 is preferably substantially the same, with the diameter determined by the center conductoris frequency and impedance requirement, thereby minimizing manufacturing costs. In particular, the diameter of and the spacing between each ball should be such that the coaxial interconnection ball grid array 10 electrically matches the impedance of the coaxial line 26, which for an example implementations in glass/epoxy for frequencies in the range of about 0 to 47.8 Ghz, typically has a dielectric constant of about 4.2, characteristic impedance of about 50 ohms, center conductor inside diameter of about 11.7 mils (0.00461 cm) and outer conductor inside diameter of about 65 mils (0.02559 cm). For frequencies in the range of about 0 to 47.8 Ghz, the diameter of each solder ball 16, 20 and 22 is preferably about 13 mils (0.00512 cm), with a tolerance of about +/−2 mils (0.00079 cm). At a diameter of 13 mils, the discontinuity in a typical transmission line is minimized. The solder balls 16, 20 and 22 are preferably substantially equally spaced and positioned along the same plane. Assuming a ball diameter of 13 mils (0.00512 cm), the solder balls 16, 20 and 22 are preferably spaced about 30 mils (0.0118 cm) center-to-center from each other, with a tolerance of about +/−2 mils (0.00079 cm).

For a diameter of about 13 mils (0.00512 cm) and spacing of about 30 mils (0.0118 cm), the cutoff frequency of the next higher order mode (TE11) is about 47.8 Ghz. The present invention is not, however, limited to operation at about 47.8 Ghz and below with the particular dimensions noted above. Rather, the present invention can be utilized at frequencies higher than 47.8 Ghz, such as from about 0 to 60 Ghz, by feeding the coaxial interconnection ball grid array 10 straight as illustrated in FIG. 1 such that the next higher order mode is not excited. Moreover, the diameter of and distance between adjacent solder balls 16, 20 and 22 may be adjusted to accommodate the connecting coax and provide the desired frequency and impedance requirement. Moreover, board materials may be changed to provide suitable dielective constraints. In order to raise the higher mode cutoff frequency, the ball diameter and grid array size would generally have to be reduced.

The solder balls 16, 20 and 22 may be commercially available solder balls, such as those constructed of 90% Pb to 10% Sn or 63% Pb to 37% Sn, and during manufacture may be initially heated and cooled to form a solder connection between the IMA modules 12 and the circuit board 14. The method of manufacture of the solder ball array 10 is not, however, critical to the implementation of the present invention.

In accordance with a preferred embodiment of the invention, a coaxial-like interconnection is thus formed from an array of solder balls configured preferably in a three-by-three square array. The electromagnetic geometry allows microwaves to propagate from a printed circuit board 14 to one or more IMA modules 12. The coaxial interconnection ball grid array 10 connects desired coaxial lines from millimeter wave multifunction modules 12, thereby allowing a multitude of millimeter wave modules 12 to be soldered to a circuit board 14 and reducing packaging costs and complexity.

Referring to FIGS. 2 and 3, the coaxial interconnection ball grid array 10 is shown integrated as part of a larger general ball grid array 28. As a result, high frequency signal generation, signal reception and digital processing can be combined in a single electronic component, such as a circuit board 14. Implementation of the coaxial interconnection ball grid array 10 is not limited to the specific location illustrated in FIG. 2. Rather, the position of the coaxial interconnection ball grid array 10 can be anywhere within the general ball grid array and is generally dictated by the coaxial requirements of the circuit board 14 and IMA module 12 and the geometrical array requirements of the present invention. Additionally, more than one coaxial interconnection ball grid array 10 can be implemented within the general ball grid array 28, thereby facilitating the typical multiple coaxial line requirements of conventional and newly developed IMA modules 12. Each portion of the general ball grid array 28 utilized as a coaxial interface would comprise a three-by-three array of solder balls 16, 20 and 22 as illustrated in FIG. 1 and described above. The remainder of the general ball grid array 28 may be utilized as connectors or direct interfaces between the circuit board 14, IMA modules 12 and/or other components. High frequency signal generation, signal reception and digital processing can thus be combined in a single circuit board 14 utilizing BGA packaging adapted to receive high frequency signals from a coaxial connection. Moreover, since the coaxial interconnection ball grid array 10 is implemented as part of a general ball grid array 28 and without the interconnection between the IMA module 12 and the circuit board 14 is generally indistinguishable from the other balls in the general ball grid array 28, manufacturing is economical and simple.

Referring to FIG. 3, in a typical configuration, the coaxial interconnection ball grid array 10 of the present invention is integrated as part of a larger pin grid array 28 on a circuit board 14 which is suspended between a radiator panel 30 and a radiation shield 32. The circuit board 14 is conventionally mounted by fasteners 34 on raised standoffs or posts 36 integral with the radiator panel 30. Other fasteners 34 are used to secure the radiation shield 32 to the radiator panel 30. Integrated circuit chips and/or chip packages 12, such as a high frequency IMA 12 with coaxial interface, are mounted above and beneath the circuit board 14. Thermally conductive adhesive material 38 may be utilized between the chip or package 12 and the surface of the radiator panel 30. The chips or packages 12 are positioned directly over heat pipes 40 located on the opposite face of the radiator panel 30. The coaxial interconnection ball grid array 10 of the present invention is positioned between the circuit board 14 and the IMAs modules 12. High frequency signals emanating from a circuit board 14 can thus be transmitted to an IMA module 12 utilizing the coaxial interconnection ball grid array 10, thereby facilitating manufacture of highly integrated microwave networks. For example, IMA modules 12 can be connected together through ismart boardsî (i.e., a low-power microprocessor). Moreover, since the coaxial interconnection ball grid array 10 is generally integrated as part of a larger general ball grid array, high frequency signal generation, signal reception and digital processing can be combined in a single electronic component, such as the circuit board 14.

It will be appreciated by persons skilled in the art that the present invention is not limited to what has been shown and described hereinabove, nor the dimensions of sizes of the physical implementation described immediately above. The scope of invention is limited solely by the claims which follow.

What is claimed is:

1. An apparatus for interfacing with a high frequency coaxial device having a central and ground conductor, comprising:

a plurality of electrically conductive structures disposed in an array, said plurality of electrically conductive structures including a centrally disposed spherical structure having a given diameter for receiving said central conductor of said coaxial device, and a plurality of ground structures disposed about said centrally disposed structure for receiving said ground conductor of said coaxial device, wherein said diameter and a spacing of said centrally disposed structure is determined in relation to said plurality of ground structures so as to electrically match an impedance associated with said high frequency coaxial device.

2. The apparatus claimed in claim 1, wherein said array is disposed in a second array comprising a plurality of said electrically conductive structures.

3. The apparatus claimed in claim 1, wherein said central and ground electrically conductive structures are disposed in a three-by-three array.

4. The apparatus claimed in claim 1, wherein said central and ground electrically conductive structures are comprised of solder.

5. The apparatus claimed in claim 1 wherein said central and ground electrically conductive structures comprise electrically conductive epoxy.

6. The apparatus claimed in claim 1, wherein said central and ground electrically conductive structures are electrically conductive balls.

7. The apparatus claimed in claim 6, wherein said central and ground electrically conductive balls have a diameter which facilitates electrically matching said impedance of said coaxial device.

8. The apparatus claimed in claim 7, wherein said diameter of said central and ground electrically conductive balls facilitates electrically matching an impedance of 50 ohms.

9. The apparatus claimed in claim 7, wherein said central and ground electrically conductive balls have a diameter of about 13 mils.

10. The apparatus claimed in claim 7, wherein said central and ground electrically conductive balls have a spacing which facilitates electrically matching said impedance of said coaxial device.

11. The apparatus claimed in claim 10, wherein said central and ground electrically conductive balls are spaced center-to-center about 30 mils from each other.

12. A high frequency coaxial interconnection ball grid array for providing connection to a coaxial line having a first and second conductor, comprising:

a center disposed electrically conductive ball for interfacing with said first conductor of said coaxial line; and a plurality of outer electrically conductive balls disposed about said center disposed ball for interfacing with said second conductor of said coaxial line, wherein said center conductive ball and said plurality of outer conductive balls are disposed in a three-by-three configuration in order to electrically match an impedance of said coaxial line with said high frequency coaxial interconnection ball grid array.

13. The coaxial interconnection ball grid array claimed in claim 12, wherein said coaxial interconnection ball grid array is disposed within a second ball grid array comprising a plurality of electrically conductive balls.

14. The coaxial interconnection ball grid array claimed in claim 12, wherein said center and outer electrically conductive balls are comprised of solder.

15. The apparatus claimed in claim 12 wherein said central and ground electrically conductive structures comprise electrically conductive epoxy.

16. The coaxial interconnection ball grid array claimed in claim 12, wherein said coaxial interconnection ball grid array is operable within the frequency range of 0 to 60 Ghz.

17. The coaxial interconnection ball grid array claimed in claim 12, wherein said center and outer electrically conductive balls have a diameter which facilitates electrically matching said impedance of said coaxial device.

18. The coaxial interconnection ball grid array claimed in claim 17, wherein said center and outer electrically conductive balls have a spacing which facilitates electrically matching said impedance of said coaxial device.

19. The coaxial interconnection ball grid array claimed in claim 17, wherein said diameter of said center and outer electrically conductive ball facilitates electrically matching an impedance of 50 ohms.

20. The coaxial interconnection ball grid array claimed in claim 19, wherein said center and outer electrically conductive balls have a diameter of about 13 mils.

21. The coaxial interconnection ball grid array claimed in claim 20, wherein said center and outer electrically conductive balls are spaced center-to-center about 30 mils from each other.

22. A packaging structure, comprising:

a circuit board;

a circuit board chip package connected to said circuit board, wherein said circuit board chip package includes at least one high frequency coaxial interface having a central and ground conductor; and a plurality of electrically conductive structures disposed in an array, said plurality of electrical conductive structures including a centrally disposed structure for receiving said central conductor of said high frequency coaxial interface and a plurality of ground structures disposed about said centrally disposed structure for receiving said ground conductor of said coaxial interface, wherein said array is disposed between said circuit board and said circuit board chip package, wherein said central and ground structures have diameters and spacings which facilitate electrically matching an impedance of said coaxial interface.

23. The packaging structure claimed in claim 22, wherein said array provides for a coaxial connection between said circuit board and said circuit board chip package.

24. The packaging structure claimed in claim 22, wherein said circuit board chip package is an integrated microwave assembly module.

25. The packaging structure claimed in claim 22, wherein said central and ground electrically conductive structures are disposed in a three-by-three array.

26. The packaging structure claimed in claim 22, wherein said central and ground electrically conductive structures are electrically conductive balls.

27. The packaging structure claimed in claim 23, wherein said central and ground electrically conductive structures have a diameter of about 13 mils and are spaced center-to-center about 30 mils from each other.

28. A high frequency interconnection ball grid array for coaxially interconnecting an integrated microwave assembly with a circuit board assembly, comprising:

a center disposed solder ball for mating with an inner conductor of a coaxial line; and a plurality of outer disposed solder balls for mating with an outer conductor of said coaxial line, wherein said center and outer solder balls have a diameter and a spacing which facilitates electrically matching an impedance of said coaxial line so as to provide a low loss connection between said integrated microwave assembly and said circuit board assembly.

29. The interconnection ball grid array claimed in claim 28, wherein said interconnection ball grid array is disposed within a second ball grid array comprising a plurality of solder balls.

30. The interconnection ball grid array claimed in claim 28, wherein said center and outer solder balls are disposed in an array configuration.

31. The interconnection ball grid array claimed in claim 28, wherein said center and outer solder balls are substantially equally spaced from each other.

32. The interconnection ball grid array claimed in claim 30, wherein said diameter of said center and outer solder ball facilitates electrically matching an impedance of 50 ohms.

33. The interconnection ball grid array claimed in claim 32, wherein said center and outer solder balls have a diameter of about 13 mils.

34. The interconnection ball grid array claimed in claim 33, wherein said center and outer solder balls are spaced center-to-center about 30 mils from each other.

* * * * *